United States Patent
Pandey et al.

(10) Patent No.: US 11,529,592 B2
(45) Date of Patent: *Dec. 20, 2022

(54) GAS INJECTOR WITH BAFFLE

(71) Applicant: Applied Materials, Inc., Santa Clara, CA (US)

(72) Inventors: Vishwas Kumar Pandey, Madhya Pradesh (IN); Lara Hawrylchak, Gilroy, CA (US); Eric Kihara Shono, San Mateo, CA (US); Kartik Shah, Saratoga, CA (US); Christopher S. Olsen, Fremont, CA (US); Sairaju Tallavarjula, Santa Clara, CA (US); Kailash Pradhan, Campbell, CA (US); Rene George, San Carlos, CA (US); Johanes F. Swenberg, Los Gatos, CA (US); Stephen Moffatt, St. Brelade (JE)

(73) Assignee: APPLIED MATERIALS, INC., Santa Clara, CA (US)

(*) Notice: Subject to any disclaimer, the term of this patent is extended or adjusted under 35 U.S.C. 154(b) by 33 days.

This patent is subject to a terminal disclaimer.

(21) Appl. No.: 17/365,791

(22) Filed: Jul. 1, 2021

(65) Prior Publication Data

US 2021/0322934 A1    Oct. 21, 2021

Related U.S. Application Data

(63) Continuation of application No. 16/116,531, filed on Aug. 29, 2018, now Pat. No. 11,077,410.

(30) Foreign Application Priority Data

Oct. 9, 2017    (IN) .............................. 201741035705

(51) Int. Cl.
*C23C 16/455*    (2006.01)
*B01F 23/10*    (2022.01)
(Continued)

(52) U.S. Cl.
CPC ............. *B01F 23/191* (2022.01); *B01J 4/002* (2013.01); *B01J 4/005* (2013.01); *B01J 4/007* (2013.01);
(Continued)

(58) Field of Classification Search
CPC ......... B01F 3/028; B01F 23/191; B01J 4/005; B01J 4/002; B01J 4/007; B01J 8/22;
(Continued)

(56) References Cited

U.S. PATENT DOCUMENTS

| | | |
|---|---|---|
| 5,558,717 A | 9/1996 | Zhao et al. |
| 5,792,272 A | 8/1998 | van Os et al. |

(Continued)

FOREIGN PATENT DOCUMENTS

| | | |
|---|---|---|
| JP | 2006313774 A | 11/2006 |
| JP | 2013516080 A | 5/2013 |

(Continued)

OTHER PUBLICATIONS

PCT International Search Report/Written Opinion dated Dec. 17, 2018 for Application No. PCT/US2018/048883.

(Continued)

*Primary Examiner* — Rudy Zervigon
(74) *Attorney, Agent, or Firm* — Patterson + Sheridan, LLP

(57) ABSTRACT

Gas injectors for providing uniform flow of fluid are provided herein. The gas injector includes a plenum body. The plenum body includes a recess, a protrusion adjacent to the recess and extending laterally away from the plenum body, and a plurality of nozzles extending laterally from an exterior surface of the plenum body. The plenum body has a plurality of holes in an exterior wall of the plenum body. Each nozzle is in fluid communication with an interior (Continued)

volume of the plenum body. By directing the flow of fluid, the gas injector provides for a uniform deposition.

20 Claims, 8 Drawing Sheets

(51) Int. Cl.
*B01J 8/22* (2006.01)
*H01L 21/67* (2006.01)
*B01J 4/00* (2006.01)
(52) U.S. Cl.
CPC ........... *B01J 8/22* (2013.01); *C23C 16/45563* (2013.01); *H01L 21/67017* (2013.01); *B01J 2208/00902* (2013.01); *B01J 2208/00929* (2013.01)
(58) Field of Classification Search
CPC ... B01J 2208/00902; B01J 2208/00929; C23C 16/45563; C23C 16/45578; C23C 16/45565; C23C 16/45561; C23C 16/45574; C23C 16/455; C23C 16/45548; C23C 16/45572; C23C 16/45587; H01L 21/67017; H01J 37/3244; B05B 1/005
USPC ..................... 118/715; 156/345.33, 345.34
See application file for complete search history.

(56) References Cited

U.S. PATENT DOCUMENTS

| | | | |
|---|---|---|---|
| 6,387,207 B1 | 5/2002 | Janakiraman et al. | |
| 6,929,830 B2 | 8/2005 | Tei et al. | |
| 8,074,599 B2 | 12/2011 | Choi et al. | |
| 8,382,939 B2 * | 2/2013 | Kutney ............... | H01J 37/3244 156/345.46 |
| 8,702,867 B2 | 4/2014 | Choi et al. | |
| 10,840,066 B2 * | 11/2020 | Hsu .................. | H01J 37/32715 |
| 2002/0011215 A1 | 1/2002 | Tei et al. | |
| 2003/0124842 A1 | 7/2003 | Hytros et al. | |
| 2003/0203125 A1 | 10/2003 | Tei et al. | |
| 2004/0129211 A1 | 7/2004 | Blonigan et al. | |
| 2006/0228496 A1 | 10/2006 | Choi et al. | |
| 2008/0185104 A1 | 8/2008 | Brcka | |
| 2009/0120368 A1 | 5/2009 | Lubomirsky et al. | |
| 2009/0165718 A1 | 7/2009 | Lee et al. | |
| 2010/0024727 A1 | 2/2010 | Kim et al. | |
| 2010/0116210 A1 | 5/2010 | Kato et al. | |
| 2011/0006038 A1 | 1/2011 | Kutney et al. | |
| 2012/0164845 A1 | 6/2012 | Liu et al. | |
| 2013/0084391 A1 | 4/2013 | Lee et al. | |
| 2014/0273410 A1 | 9/2014 | Abedijaber et al. | |
| 2015/0079309 A1 | 3/2015 | Krueger et al. | |
| 2019/0105614 A1 | 4/2019 | Pandey et al. | |

FOREIGN PATENT DOCUMENTS

| | | |
|---|---|---|
| JP | 2016156094 A | 9/2016 |
| KR | 20060117613 A | 11/2006 |
| KR | 20080110652 A | 12/2008 |
| KR | 20100071604 A | 6/2010 |
| KR | 20150114114 A | 10/2015 |

OTHER PUBLICATIONS

Taiwan Office Action dated Jul. 25, 2019 for Application No. 107131704.
Taiwan Office Action dated Feb. 2, 2021 for Application No. 109108364.
Korean Office Action dated Jun. 2, 2021 for Application No. 10-2020-7013257.
Taiwan Office Action dated Dec. 13, 2021 for Application No. 110137510.
Japanese Office Action dated Apr. 12, 2022 for Application No. 2020-520072.
Japan Office Action dated Jul. 27, 2021 for Application No. 2020-520072.
Korean Office Action dated May 10, 2022 for Application No. 10-2022-7005911.

* cited by examiner

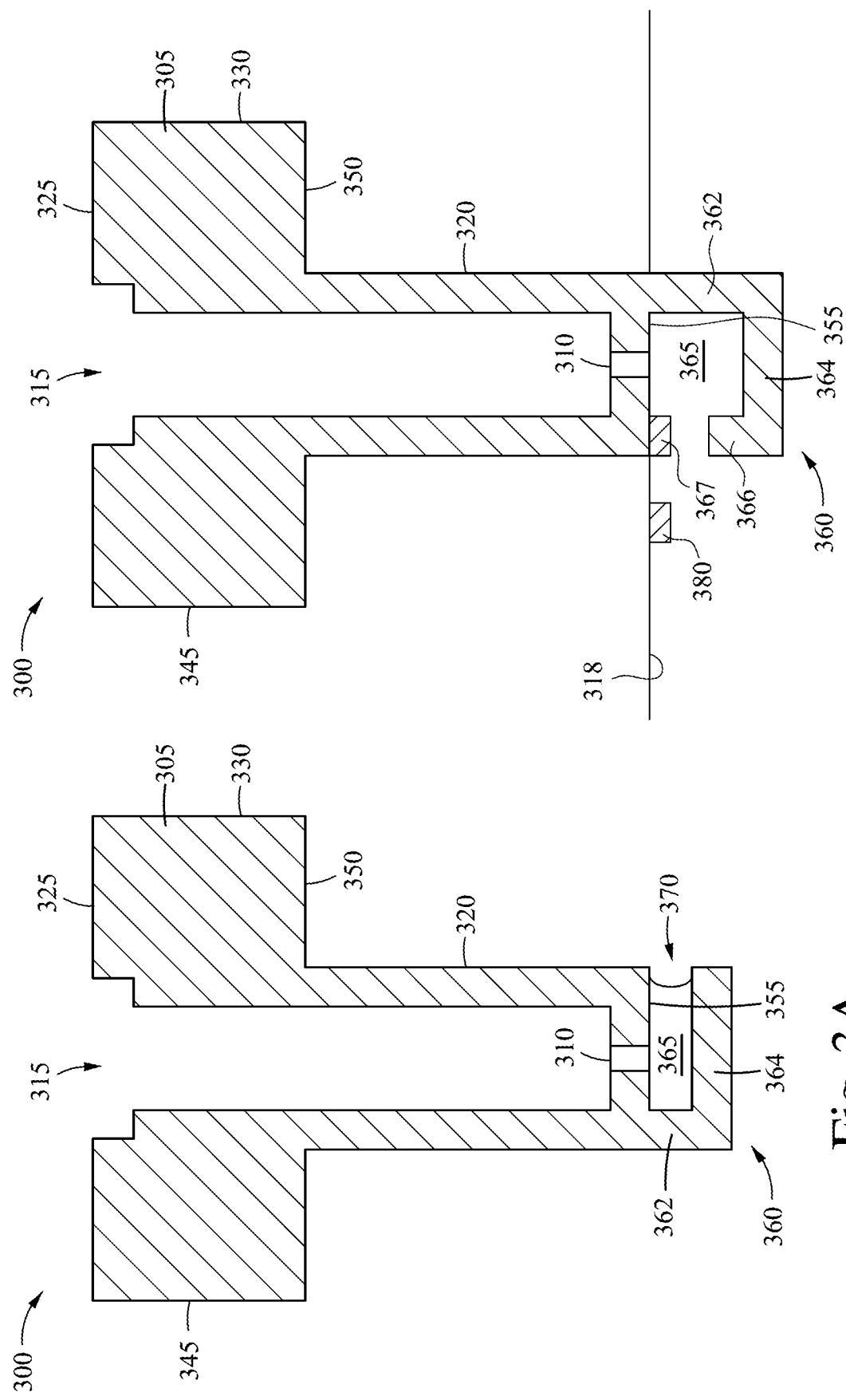

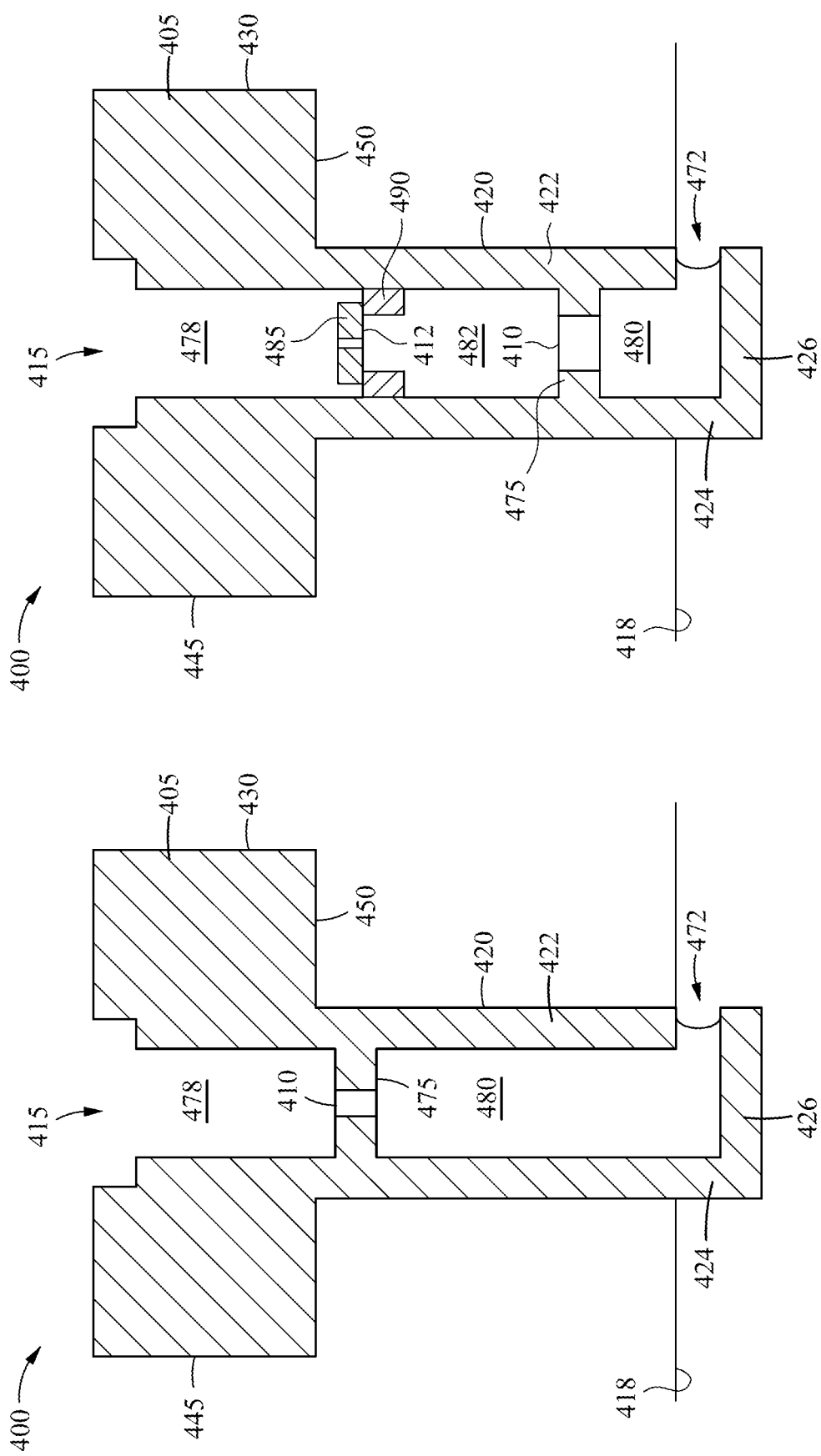

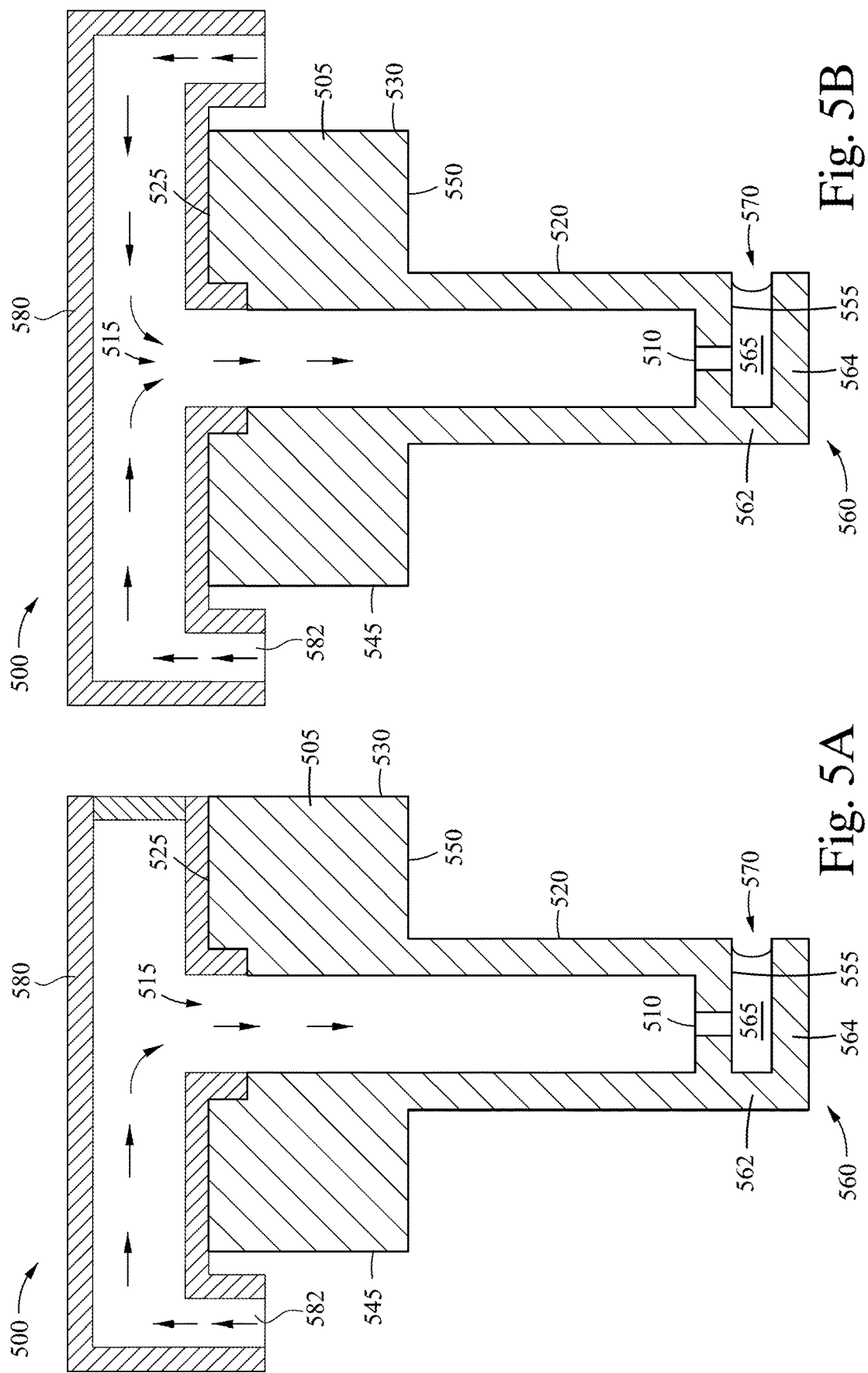

GAS INJECTOR WITH BAFFLE

CROSS-REFERENCE TO RELATED APPLICATIONS

This application is a continuation of U.S. application Ser. No. 16/116,531, filed Aug. 29, 2018, which claims benefit of Indian provisional Appl. No. 201741035705, filed Oct. 9, 2017, which are herein incorporated by reference in their entirety.

BACKGROUND

Field

Embodiments described herein generally relate to a gas injector insert providing for uniform flow of fluid.

Description of the Related Art

Semiconductor fabrication processing is generally accomplished by introducing a precursor gas or gas mixture into a vacuum chamber that contains a substrate. The precursor gas or gas mixture in the chamber undergoes a chemical reaction with the addition of heat and deposits on the substrate. The process gas travels through several components before reaching the substrate. The gas flow is directed from a gas injector and through a tunnel. The tunnel directs gas flow towards the substrate as process gases enter the processing chamber. Process gases enter the tunnel at a high velocity through the gas inject of the cartridge. The momentum of the gas flow carries the process gases to the substrate where deposition occurs. The gas flows from the gas inject to the tunnel and towards the substrate.

However, any variations in process conditions affect the gas flow pathway and thus deposition uniformity. One such process condition affecting gas flow path is the variation in gas injector installation or gas injector manufacturing. The changes in the flow as the gas comes in contact with the gas injector cause variations in deposition and thus affect uniformity.

Therefore, there is a need for an improved gas injector insert capable of providing a uniform gas flow pathway.

SUMMARY

Embodiments described herein generally relate to a gas injector providing for uniform flow of fluid. In one or more embodiments, a gas injector is disclosed. The gas injector includes a plenum body. The plenum body includes a recess, a protrusion adjacent to the recess and extending laterally away from the plenum body, and a plurality of nozzles extending laterally from an exterior surface of the plenum body. The plenum body has a plurality of holes in an exterior wall of the plenum body. Each nozzle is in fluid communication with an interior volume of the plenum body.

In other embodiments, a gas injector is disclosed. The gas injector includes a plenum body. The plenum body includes a recess and a protrusion adjacent to the recess and extending laterally away from the plenum body. The protrusion has a plurality of holes and a baffle adjacent the plurality of holes. The plurality of holes provides fluid communication between an interior volume of the plenum body and the baffle.

In other embodiments, a gas injector is disclosed. The gas injector includes a plenum body. The plenum body includes a recess and a protrusion adjacent to the recess and extending laterally away from the plenum body. The protrusion includes a divider disposed across an interior volume of the plenum body separating the interior volume into a first volume adjacent to the recess and a second volume. The divider has a plurality of holes that provide fluid communication between the first volume and the second volume. The protrusion also includes an opening in fluid communication with the second volume.

BRIEF DESCRIPTION OF THE DRAWINGS

So that the manner in which the above recited features of the disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of scope, for the disclosure may admit to other equally effective embodiments.

FIGS. 3A-3D show a sectional view of a gas injector according to embodiments described herein.

FIGS. 4A-4B show a sectional view of a gas injector according to embodiments described herein.

FIGS. 5A-5B show a sectional view of a gas injector according to embodiments described herein.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein generally relate to a gas injector providing for uniform flow of fluid. In one or more embodiments, the gas injector includes a plenum body with a recess, a protrusion adjacent to the recess and extending laterally away from the plenum body, and a plurality of nozzles extending laterally from an exterior surface of the plenum body. The plenum body has a plurality of holes in an exterior wall of the plenum body. Each nozzle is in fluid communication with an interior volume of the plenum body. By directing the flow of fluid, the gas injector provides for a more uniform deposition.

Figure 1:
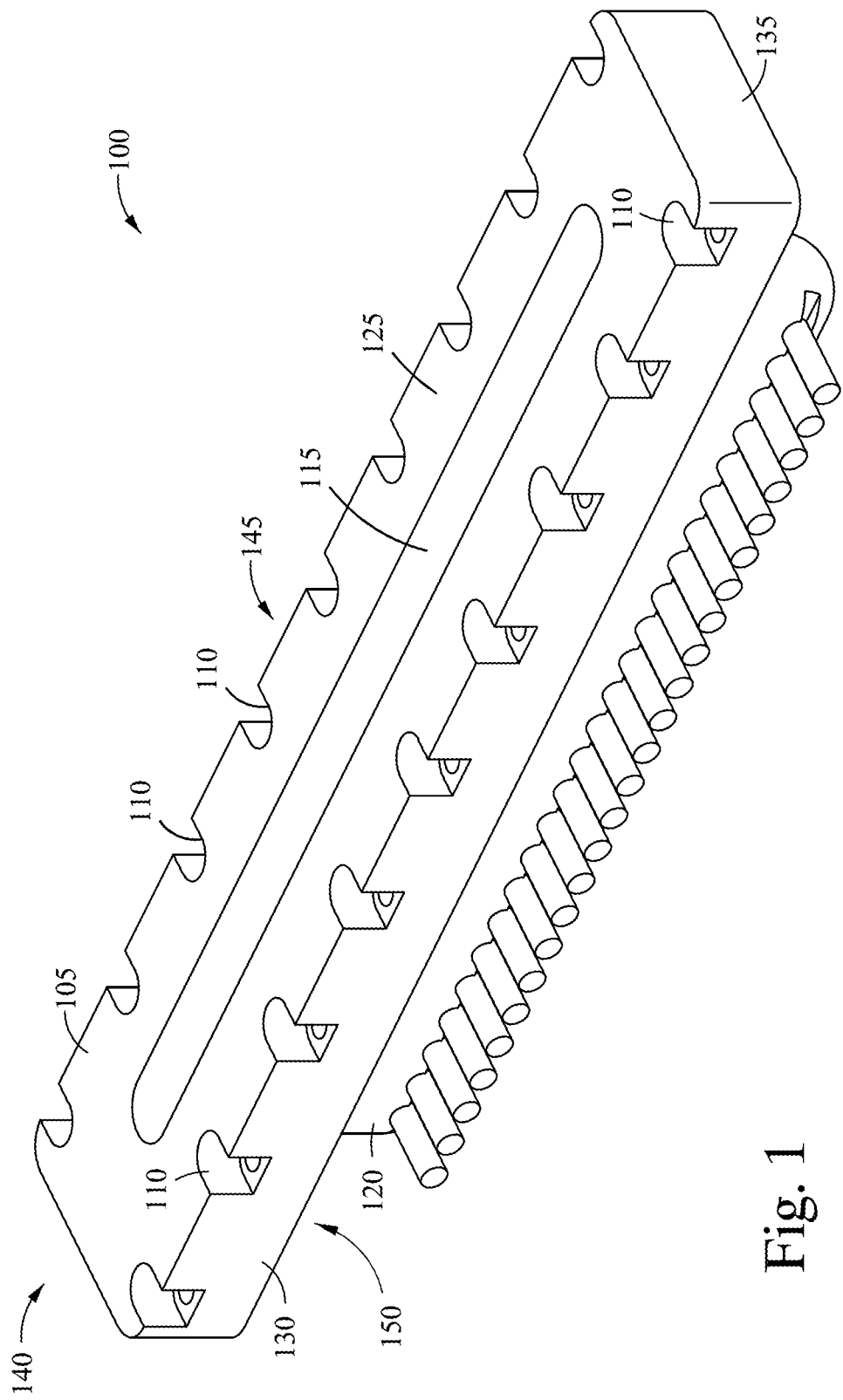
FIG. 1 shows a prospective view of a gas injector according to one or more embodiments described herein.

FIG. 1 shows a perspective view of a gas injector 100 according to one or more embodiments described herein. The various gas injectors described herein may be used in any suitable deposition process, such as a furnace, a temperature-controlled chamber, or a chemical vapor deposition (CVD) process. One suitable chamber that may be used is a VANTAGE® RADOX™ RTP chamber available from Applied Materials, Inc., Santa Clara, Calif. Another suitable chamber may be a PRODUCER® CVD chamber also available from Applied Materials, Inc., Santa Clara, Calif. Other systems from other manufacturers may also benefit from the gas injectors described herein. The gas injector 100 is inserted into a process chamber with a passage for a fluid formed therein. In one or more embodiments, the gas injector 100 has a plenum body 105 and a protrusion 120 attached to the plenum body 105. The various gas injectors described herein may be machined or 3D printed. The various gas injectors described herein may be a single piece or may be various pieces joined together.

The plenum body 105 includes a first surface 125, a second surface 150, a third surface 130, a fourth surface 145, a fifth surface 135, and a sixth surface 140. The first surface 125 may be a flange. The first surface 125 may be a top surface. The second surface 150 may be a bottom surface. Each of the third surface 125, the fourth surface 145, the fifth surface 135, and the sixth surface 140 may be side surfaces. In one or more embodiments, the body 105 is rectangular with rounded edges. The plenum body 105 includes rounded corners and a centrally located recess 115. The first surface 125 is opposite the second surface 150. The third surface 130 is orthogonal to the first surface 125 and opposite the fourth surface. The fifth surface 135 is opposite the sixth surface 140 and orthogonal to the first surface 125. The third surface 130 and the fourth surface 145 may have about equal lengths. The fifth surface 135 and the sixth surface 140 may have about equal lengths. The length of the third surface 130 may be greater than the length of the fifth surface 135. In one or more embodiments, the length of the third surface 130 is in a range from about 12 inches to about 16 inches. The length of the fifth surface 135 is in a range from about 1 inch to about 3 inches.

A plurality of holes 110 is disposed in the first surface 125 of the plenum body 105. The plurality of holes 110 is disposed towards the outer edges of the first surface 125 and extend into the third surface 130 on one side and the fourth surface 145 on the opposite side. Thus, the plurality of holes 110 is formed in an exterior wall of the plenum body 105 and extends into two surfaces of the plenum body 105. In one or more embodiments, the plurality of holes is disposed along the length of the first surface 125. In one or more embodiments, there are a greater number of holes at the intersection of the first surface 125 with the fourth surface 145 than at the intersection of the first surface 125 with the third surface 130. The number of holes 110 may vary from about 10 to about 15. Each of the holes 110 may be a half circle in shape. For example, each of the holes 110 may extend through two surfaces of the body 105 forming a "D" shape. The gas injector 100 attaches to a process chamber with one or more fasteners through the plurality of holes 110. The fasteners may be screws, bolts, clips, or the like. In one or more embodiments, the gas injector 100 is attached to a base plate in a processing chamber with screws through the plurality of holes 110.

The recess 115 is centrally disposed within the first surface 125 of the plenum body 105. The recess 115 of FIG. 1 is rectangular in shape with rounded corners. In other embodiments, the recess 115 may be elliptical or oblong. The length of the recess may be in a range from about 11 inches to about 13 inches. The width of the recess may be in a range from about 0.15 inches to about 0.25 inches. In operation, process gases flow through the recess 115 from a gas inject (not shown). The recess 115 extends through the interior of the protrusion 120.

The protrusion 120 extends from the second surface 150. FIG. 2A shows a sectional view of the gas injector 100 of FIG. 1. A plurality of nozzles 210 extend laterally from the exterior surface of the plenum body 105. In one or more embodiments, the plurality of nozzles 210 extends laterally from the protrusion 120. Although only two nozzles 210 are shown in FIG. 2A, there may be a plurality of nozzles 210 on each side. In one or more embodiments, the number of nozzles 210 may be between 4 and 20. In the embodiment of FIG. 2A, the plurality of nozzles 210 are disposed on both sides of the protrusion 120. In other embodiments, the plurality of nozzles 210 may be disposed on one side alone. The plurality of nozzles 210 may have a cross-sectional shape that is circular, square, rectangular, obround, oblong, oval, or any other geometric shape. The recess 115 is in fluid communication with the nozzles 210. The plurality of nozzles 210 may extend a distance less than the width of the body 105. In one or more embodiments, the nozzles 210 extend a distance from about 0.3 inches to about 0.5 inches from the protrusion 120. Each nozzle 210 is in fluid communication with the interior volume of the plenum body 105. Each nozzle 210 has an opening 215. In one or more embodiments, the width of each opening 215 may be substantially the same. When the gas injector 100 is installed in a chamber, the nozzles 210 may be adjacent to a base ring 216 of the chamber such that the opening 215 faces a surface of the base ring 216. The base ring 216 and the gas injector 100 are disposed adjacent to the roof 218 of a gas passage.

Figure 2B:
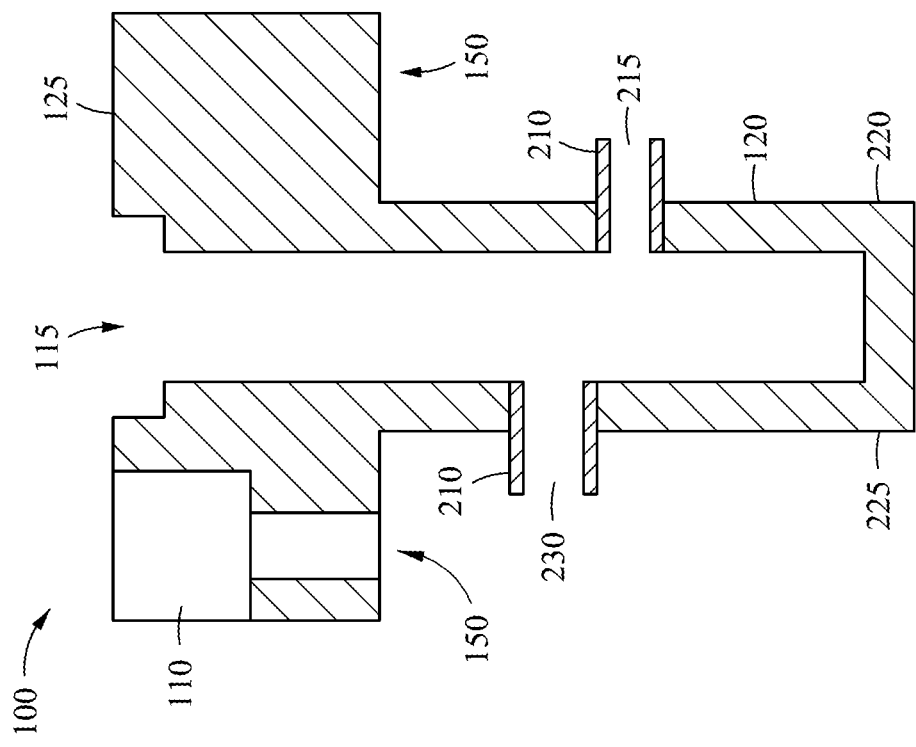
FIGS. 2A-2B show a sectional view of the gas injector according to embodiments described herein.
Figure 2A:
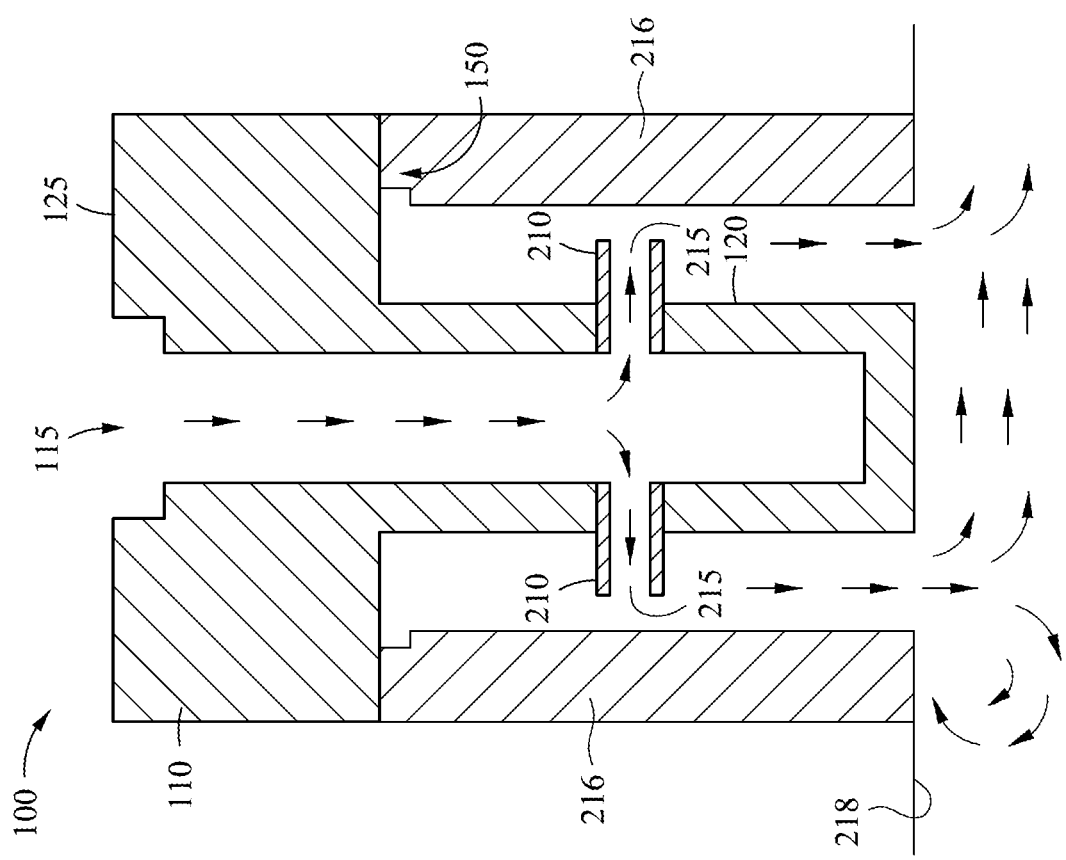

In other embodiments, the width of each opening 215, 230 may vary, as seen in FIG. 2B. For example, all the nozzles 210 on a first side 220 of the protrusion 120 may have substantially the same size opening 215 while the nozzles 210 on a second side 225 may have different size opening 230. Each of the nozzles 210 on the second side 225 may have the same size opening 230 but be different than the nozzles 210 on the first side 220. For example, the plurality of openings 215 may have a different circumference than the plurality of openings 230. In other embodiments, the openings 215 are all the same size while the openings 230 vary in size. In some examples, the nozzles 210 may be disposed on the protrusion 120 at various distances from the second surface 150. In other examples, more than one nozzle 210 on a single side may be aligned in a perpendicular direction to the second surface 150. For example, the first side 220 may include more than one nozzle 210 disposed one on top of the other or stacked. In operation, fluid flows through the recess 115, to the nozzles 210, and exits the gas injector 100 through the opening 215. The fluid continues through a passage formed in between the gas injector 100 and the base ring 216 towards a tunnel, as shown by arrows in FIG. 2A that depict fluid flow paths. The fluid passes through the tunnel into a processing volume of a chamber to interact with a substrate disposed within the processing volume. The nozzles 210 provide more uniform fluid flow for a more uniform deposition process.

FIGS. 3A-3D show a sectional view of a gas injector 300 according to embodiments described herein. The gas injector 300 may be used in any suitable deposition process, such as a furnace, a temperature-controlled chamber, or a chemical vapor deposition (CVD) process. The gas injector 300 may be used in an assembly to provide gases to a passage for flow into a processing chamber. The gas injector 300 has a recess 315, a body 305, and a protrusion 320. The body 305 includes a first surface 325, a second surface 350, a third surface 330, a fourth surface 345, a fifth surface, and a sixth surface. The body 305 is substantially the same as the body 105 of FIG. 1, a plurality of holes (not shown).

The protrusion 320 extends from the second surface 350. The protrusion 320 includes a plurality of holes. The cross-sectional view of FIG. 3A shows one of the holes 310. The protrusion 320 may include a plurality of holes in the bottom 355 of the protrusion 320. The plurality of holes 310 are in fluid communication with the recess 315. The plurality of holes 310 are formed through the bottom 355 of the protrusion 320. In one or more embodiments, the bottom 355 of the protrusion 320 is a wall with a thickness in a range from about 0.05 inches to about 0.07 inches. In one or more embodiments, the plurality of holes 310 is centrally located along the length of the bottom 355 of the protrusion 320. The plurality of holes 310 may be spaced equidistant from each other. In other embodiments, the plurality of holes 310 may extend through a divider 475 disposed within the protrusion 320, as seen in FIG. 4A and described in more detail below.

The protrusion 320 also includes a baffle 360. The baffle 360 forms a passage 365 with the bottom 355 of the protrusion 320. The baffle 360 includes a first extension 362 and a second extension 364. The first extension 362 extends from the bottom 355 of the protrusion 320 in a direction that is aligned with, or optionally parallel to, the direction in which the hole 310 extends. The first extension 362 may be orthogonal to the second extension 364. The second extension 364 may be spaced from the bottom 355 of the protrusion 320 a distance in a range from about 0.04 inches to about 0.05 inches. For example, the passage 365 may have a height (between the second extension 364 and the bottom 355) in a range from about 0.04 inches to about 0.05 inches. In the embodiment of FIG. 3A, the passage 365 has an opening 370 facing towards a plane defined by extending the third surface 330 of the body. In other embodiments, the opening 370 may be facing towards the fourth surface 345. The opening 370 may be continuous or discontinuous along the length of the gas injector 300. In some examples, the baffle 360 may be an end wall of the gas injector 300 connected to the protrusion 320 by a solid side wall and a perforated side wall. In such cases, the passage 365 is an exit plenum of the gas injector 300 and the perforated side wall provides a plurality of openings 370 for flowing gas from the exit plenum to the exterior of the gas injector.

In the embodiment of FIG. 3B, the baffle 360 may include a lip 366 disposed on the second extension 364. The lip 366 may be disposed anywhere along the length of the second extension 364. The lip 366 may be orthogonal to the second extension 364. The lip 366 may have any cross-sectional shape, including rectangular, square, circular, triangular, and trapezoidal. The lip 366 may have rounded edges or have a textured surface. The gas injector 300 may include an overhang 367. The overhang 367 may be substantially the same size as the lip 366. In one or more embodiments, the overhang 367 is smaller than the lip 366. In other embodiments, the overhand 367 is larger than the lip 366. The overhang 367 may be disposed on the bottom 355 of the protrusion 320. In one or more embodiments, the overhang 367 is directly opposite from the lip 366. The overhang 367 may be disposed anywhere along the bottom 355 of the protrusion 320. For example, the overhang 367 may be disposed opposite the second extension 364 of the baffle 360. The overhang 367 may be disposed adjacent to a tunnel overhang 380 disposed on the roof 318 of the tunnel. The overhang 367 may be integrally formed with the protrusion 320. Alternately, the overhang 367 may be a separate piece attached to the protrusion 320. The tunnel overhang 380 may be substantially the same size and shape as the overhang 367 of the protrusion 320, or the overhang 380 may be a different size and/or shape from the overhang 367. The tunnel overhang 380 may be disposed anywhere along the length of the roof 318 of the tunnel. In one or more embodiments, the roof 318 may include more than one tunnel overhang 380.

Figure 3D:
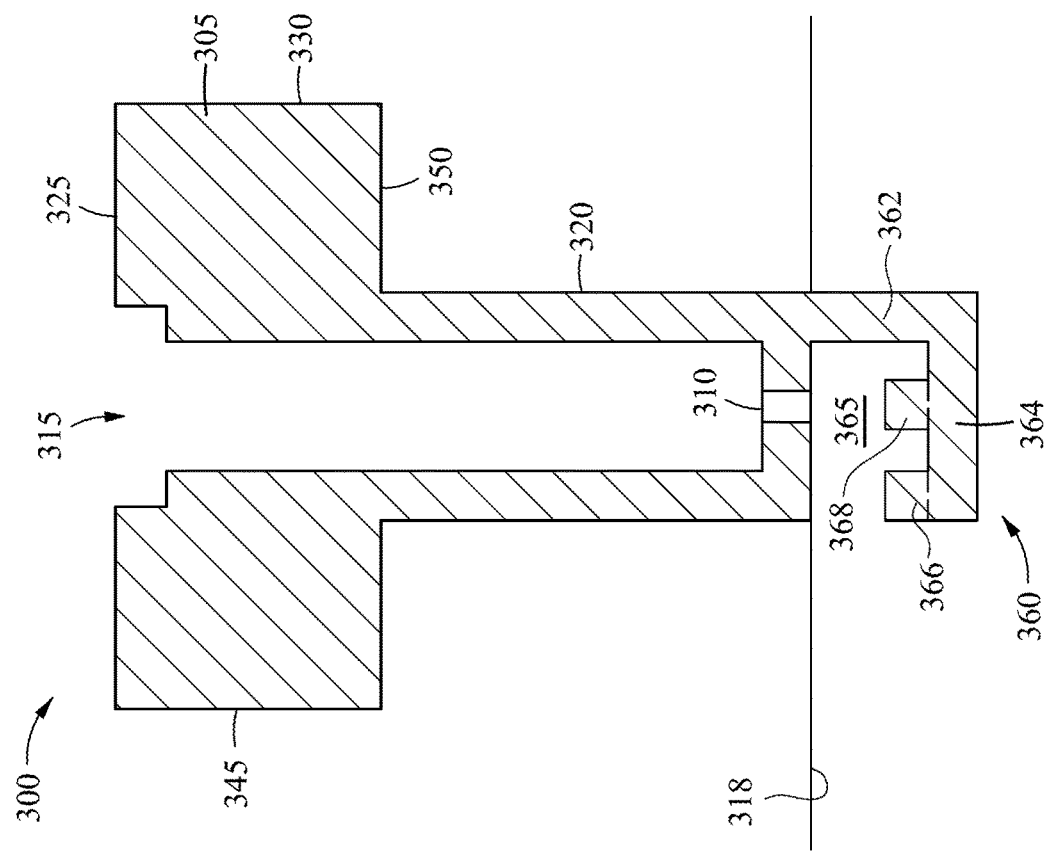
Figure 3C:
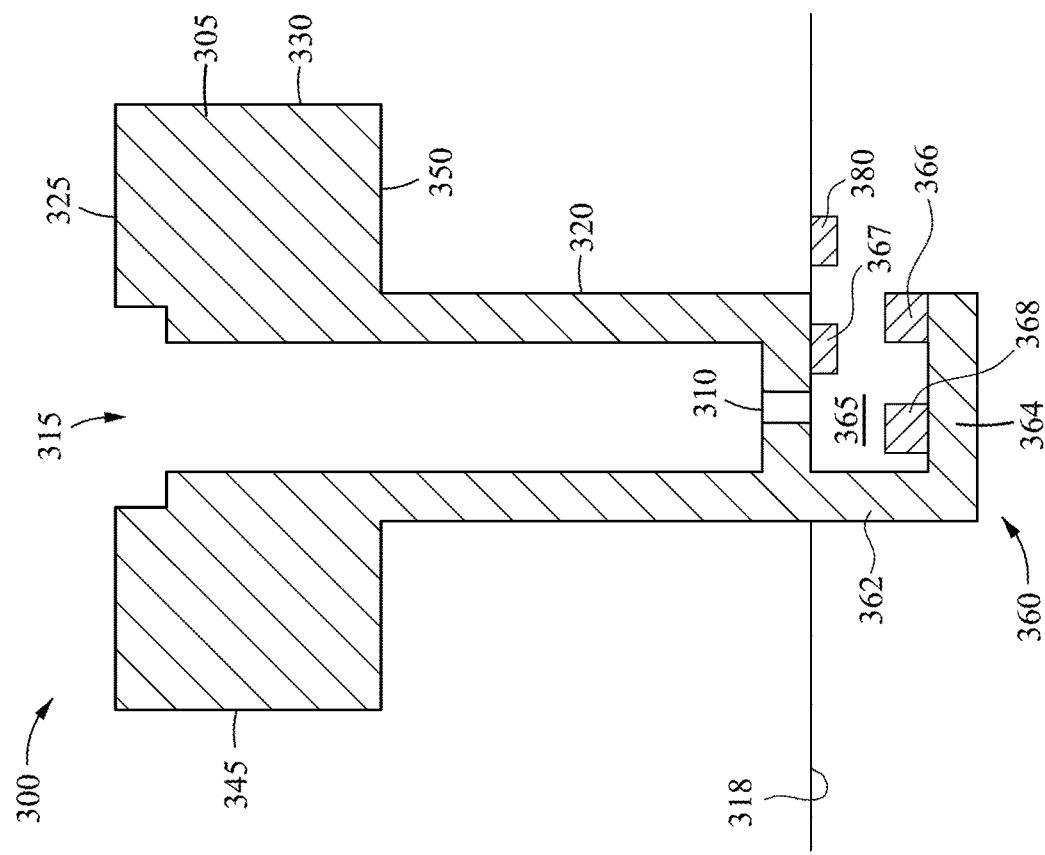

In the embodiment of FIG. 3C, the baffle 360 includes a plurality of projections, in this case a lip 366 and a projection 368 adjacent the lip 366. The projection 368 may be a separate piece attached to the second extension 364 of the baffle 360. The projection 368 may also be formed integrally with the baffle 360, or formed as a separate piece and attached to the second extension 364. The projection 368 may have any geometric shape in cross-section, including square, circular, rectangular, triangular, and trapezoidal. The projection 368 may be disposed anywhere along the length of the second extension 364. In the embodiment of FIG. 3C, the projection 368, the lip 366, the overhang 367, and the tunnel overhang 380 form a saw-tooth configuration with the projection 368 and lip 366 disposed on the second extension 364 of the baffle 360 and the overhang 367 and the tunnel overhang 380 disposed on roof 318 of the tunnel. For example, the lip 366 is disposed opposite and in between the overhang 367 and the tunnel overhang 380. Any number of the projections 368 and tunnel overhangs 380 may be included on the roof 318 of the tunnel and the baffle 360, respectively. For example, the embodiment of FIG. 3D includes the lip 366 and the projection 368. In another example, the baffle 360 may be similar to that of FIG. 3A with overhang or tunnel overhangs adjacent the baffle 360. Each of the lip 366, the projection 368, and the overhang 367 may be machined or 3D printed as one piece of the baffle 360 (e.g., monolithic) or may be attached as one or more separate pieces to the baffle 360.

The baffle 360 may be a separate piece from the protrusion 320. In other embodiments, the baffle 360 may be machined or 3D printed as part of the protrusion 320. In operation, a fluid source flows through the recess 315, through the plurality of holes 310, through the passage 365 formed by the baffle 360, and continuing to a substrate. In other embodiments, the baffle 360 may include a textured surface or coating. The textured surface or coating may be small projections between about 25 microns and about 100 microns. The small projections may be circular, continuous, discontinuous, square, rectangular, or any other geometric shape. The textured surface or coating may be disposed on the second extension 364. By providing a barrier, the baffle 360 slows the velocity of the process gases flowing from the recess 315, provides a smaller area for process gases to mix, redirects the flow of the process gases towards the substrate, and provides for a more uniform deposition on the substrate.

In the embodiment of FIG. 4A, a baffle 400 includes a divider 475. The gas injector 400 is similar to the gas injector 300 shown in FIG. 3A, except for the features described below. The divider 475 is disposed within a protrusion 420 forming a plenum 480. The divider 475 is disposed across an interior of the plenum body 405 separating the interior volume into a first volume 478 adjacent to the recess 415 and a second volume within the plenum 480. The divider 475 has a plurality of holes that provide fluid communication between the first volume 478 and the plenum 480. The protrusion 420 includes a first side wall 422, a second side wall 424 opposite the first side wall 422, and a bottom wall 426 orthogonal the first side wall 422. The first side wall 422 of the protrusion 420 is parallel the third surface 430 of the body 405. The plurality of holes 410 is disposed within the divider 475. The plenum 480 is defined, and bounded, by the divider 475, the first side wall 422, the second side wall 424, and the bottom wall 426. The protrusion 420 has an opening 472 disposed in the first wall 422. The bottom wall 426 provides a function similar to the function of the baffle 362 in FIGS. 3A-3D. In one or more embodiments, the opening 472 is disposed in the second wall 424.

In the embodiment of FIG. 4B, the baffle 400 includes the divider 475 and a blocker 485. The gas injector 400 is similar to the gas injector 300 shown in FIG. 3A, except for the differences described below. The blocker 485 has a rectangular body and is disposed within a protrusion 420. The blocker 485, together with the first side wall 420, the second side wall 424, and the divider 475, defines a plenum 482. The blocker 485 is disposed across an interior of the plenum body 405 separating the interior volume of the plenum body 405 into a first volume 478 adjacent to the recess 415 and a second volume within the plenum 482. The blocker 485 may rest upon a pair of ledges 490. In the embodiment of FIG. 4B, the pair of ledges 490 is defined by projections, rectangular in cross-section, connected to opposite interior walls of the protrusion 420. In one or more embodiments, the ledges 490 may have any other geometric shape in cross-section. In one or more embodiments, the ledge 490 is located on the interior wall of the plenum body 405. Thus, the blocker 485 may be disposed in the interior volume of the plenum body 405. The blocker 485 has a plurality of holes 412 that provide fluid communication between the interior volume of the plenum body 405 and the plenum 482. In the embodiment of FIG. 4B, the plenum 480 defines a third interior volume of the plenum body 405. The divider 475 has a plurality of holes that provide fluid communication between the plenum 482 and the plenum 480. In the embodiment of FIG. 4B, the plenum 482 is a first plenum and the plenum 480 is a second plenum. In one or more embodiments, the holes 410 of the divider 475 have a different size than the plurality of holes of the blocker 485. For example, the plurality of holes of the divider 475 may be smaller than the plurality of holes of the blocker 485 or the plurality of holes of the divider 475 may be larger than the plurality of holes of the blocker 485. In one or more embodiments, the holes of the divider 475 are the same size as the plurality of holes of the blocker 485.

In other embodiments, the bottom wall 426 may include a textured surface or coating. The textured surface or coating may be small projections extending away from an interior surface of the bottom wall at a distance between about 25 microns and about 100 microns. The small projections may be continuous or discontinuous, and may have any geometric shape in cross-section, including circular, square, and rectangular. The textured surface or coating may be disposed on the interior surface of the bottom wall 426. In operation, the textured surface may increase the dispersion of the gas, and uniformity of gas flow, along the passage 465.

FIGS. 5A-5B show a sectional view of a gas injector assembly 500 according to embodiments described herein. The gas injector assembly 500 includes the gas injector 300 and a gas inlet 580 coupled to the gas injector 300. The gas inlet 580 may have a single opening 582, as seen in FIG. 5A. In other embodiments, the gas inlet 580 may have two openings 582, 584, as seen in FIG. 5B. The first opening 582 may be on the opposite side of the gas inlet 580 from the second opening 584. The two openings 582, 584 may be on opposite sides of the gas injector assembly 500. In other embodiments, the gas inlet 580 may include an additional optional center opening that may be used in addition to, or instead of, the opening 582, the opening 584, or both of the openings 582 and 584. The gas inlet 580 may be utilized with any of the gas injectors described herein.

Figure 6B:
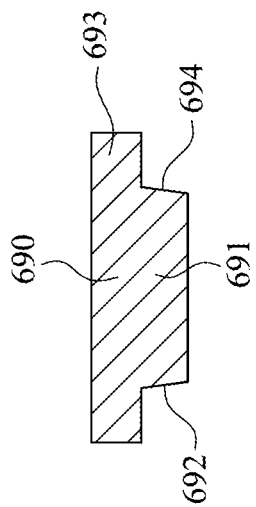
FIG. 6B shows a cross sectional view of the plug of FIG. 6A.
Figure 6A:
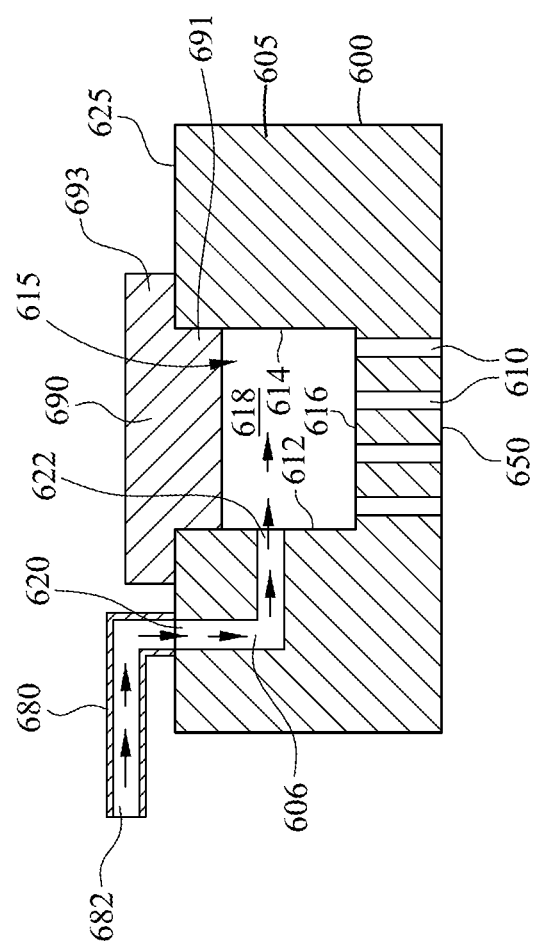
FIG. 6A shows a side view of a gas injector according to embodiments described herein.

FIG. 6A shows a side view of a gas injection assembly 600 according to embodiments described herein. The gas injection assembly 600 has a body 605 with a recess 615 formed in a first surface 625 of the body 605 and a plurality of holes 610 formed through an outlet wall 650 opposite the first surface 625. The recess 615 has a first side wall 612 and a second side wall 614 opposite the first side wall 612. The first side wall 612, the second side wall 614, and an outlet wall 616 define an interior volume 618 for gas flow through the body 605. The body 605 has a passage 606 formed therein extending from a gas inlet port 620 at the first surface 625 to an opening 622 in the first side wall 612. The passage 606 is in fluid communication with the interior volume 618 and the holes 610. A gas conduit 680 may be coupled to the gas inlet port 620 to flow gas into the passage 606, through the interior volume 618, exiting the gas injection assembly 600 through the holes 610. A cap 690 rests on the first surface 625 and engages with the recess 615 to form a plenum defined by the interior volume 618. The cap 690 has a flange portion 693 that allows the cap 690 to rest on the first surface 625 and a plug portion 691 that engages the recess 615. In the embodiment of FIG. 6A, the first and second side walls 612 and 614 are substantially perpendicular to the first surface 625 and the outlet wall 616. The plug portion 691 of the cap 690 has a shape that follows the shape of the first and second side walls 612 and 614 near the first surface 625 to provide a press fit.

In other embodiments shown in FIG. 6B, the plug portion has a tapered shape such that a width of the plug portion declines with extent into the recess 615. The first and second side walls 612 and 614 may have a tapered shape near the first surface 625 that matches the tapered shape of the plug portion 691. The tapered shape of the plug portion 691 formed by a first wall 692 and a second wall 694 shown in FIG. 6B enables easy fitting of the cap 690 into the recess 615. The cap 690 ensures that gas flowing into the interior volume 618 exits through the holes 610. The gas injection assembly 600 may be used in place of any other gas injector or gas injection assembly described herein for providing gas to a gas supply tunnel of a substrate processing chamber.

Figure 7:
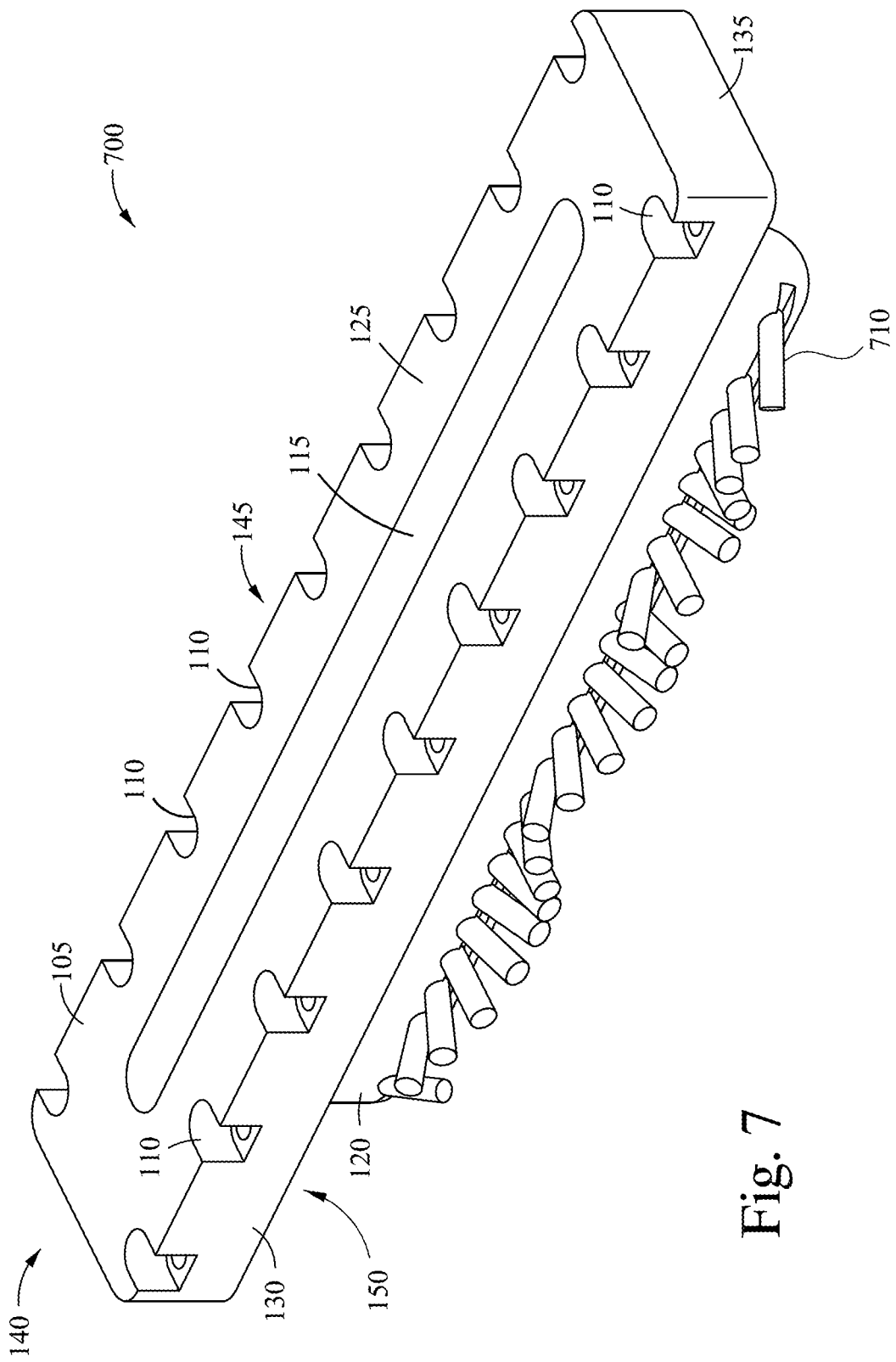
FIG. 7 shows a prospective view of a gas injector according to one or more embodiments described herein.

FIG. 7 shows a perspective view of a gas injector 700 according to one or more embodiments described herein. The gas injector 700 is similar to the gas injector 100 of FIG. 1. In the embodiment of FIG. 7, a plurality of nozzles 710 extend laterally from the exterior surface of the plenum body 105. In one or more embodiments, the plurality of nozzles 710 extends laterally from the exterior surface of the protrusion 120 at various angles to direct gas flow through the nozzles 710. For example, each nozzle 710 may extend from the protrusion 120 at a different angle. In other embodiments, each nozzle 710 may form an angle of about 30° to about 90° with the protrusion 120. In one or more embodiments, the plurality of nozzles 710 extends from the protrusion 120 in a wave or fan pattern such that each nozzle 710 forms an angle of about 10° to about 20° with each neighboring nozzle 710. The nozzles 710 at either end of the protrusion 120 may be laterally perpendicular to the protrusion 120. The nozzles between the nozzles at either end of the protrusion 120 may point in different directions such that the tips of the nozzles form a wave pattern with a peak, which may be near the center of the protrusion 120 along its length. In other embodiments, the nozzles 710 may extend laterally from the protrusion 120 at a variety of different angels. In one or more embodiments, the nozzles 710 may point laterally inward towards the center of the protrusion 120. In other embodiments, the nozzles 710 may point laterally outward away from the center of the protrusion 120. In the embodiment of FIG. 7, the nozzles 710 point in a variety of different lateral and elevation directions. For example, the outer most nozzles 710 point laterally inward while the other nozzles 710 point in a variety of elevation directions.

In other embodiments, the plurality of nozzles 710 may be spaced apart various distances from one another. The distance between each nozzle 710 and its neighbors may be uniform, non-uniform, or have a repeating pattern across all the nozzles 710. For example, in the embodiment of FIG. 7 or FIG. 1, nozzles near the center of the protrusion 120 may be spaced wider than nozzles near the ends of the protrusion 120. In another example, in the embodiment of FIG. 7 or FIG. 1, nozzles near the center of the protrusion 120 may have a smaller diameter than nozzles near the ends of the protrusion 120. Although the plurality nozzles 710 are shown only on one side in FIG. 7, there may be a plurality of nozzles 710 on each side. In one or more embodiments, the number of nozzles 710 may be in a range from about 4 to about 25. The plurality of nozzles 710 may have a cross-sectional shape that is circular, square, rectangular, obround, oblong, oval, or any other geometric shape. The recess 115 is in fluid communication with the nozzles 710. The plurality of nozzles 710 may extend a distance less than the width of the body 105. In one or more embodiments, the nozzles 710 extend from the protrusion 120 to a distance in a range from about 0.3 inches to about 0.5 inches, although the nozzles 710 may have any suitable length, and may have a variety of different lengths, which may be random or according to a pattern. Each nozzle 710 is in fluid communication with the interior volume of the plenum body 105.

While the foregoing is directed to embodiments of the disclosure, other and further embodiments may be devised without departing from the basic scope thereof, and the scope thereof is determined by the claims that follow.

What is claimed is:

1. A gas injector comprising:
    a plenum body, wherein the plenum body comprises:
        a top surface and a bottom surface opposite the top surface;
        a recess formed into the top surface; and
        a protrusion extending laterally away from the bottom surface of the plenum body, wherein the protrusion comprises:
            at least one hole formed within a divider; and
            a baffle adjacent the at least one hole, wherein the at least one hole provides fluid communication between an interior volume of the plenum body and the baffle, and wherein the interior volume extends from the recess, through the plenum body and the bottom surface, and into the protrusion; and
            an opening formed through a side wall of the protrusion and in fluid communication with the interior volume.
2. The gas injector of claim 1, wherein the baffle comprises a first extension and a second extension orthogonal the first extension.
3. The gas injector of claim 2, wherein the first extension connects to a bottom surface of the protrusion.
4. The gas injector of claim 3, wherein the second extension is spaced from the protrusion by a distance of about 0.04 inches to about 0.05 inches.
5. The gas injector of claim 1, wherein the interior volume comprises a first volume and a second volume separated by the divider, and wherein the divider has a plurality of holes that provide fluid communication between the first volume and the second volume.
6. The gas injector of claim 5, wherein the plurality of holes is disposed on a bottom surface of the protrusion.
7. The gas injector of claim 6, wherein the plurality of holes is centrally located within the bottom surface of the protrusion.
8. The gas injector of claim 5, wherein the plenum body further comprises another plurality of holes which disposed in the top surface of the plenum body.
9. The gas injector of claim 1, further comprising a textured surface or coating on an interior surface of the protrusion, the interior surface surrounding the interior volume, wherein the textured surface or coating has projections extending away from the interior surface.
10. The gas injector of claim 9, wherein the projections extend from the interior surface a distance of about 25 microns and about 100 microns.
11. A gas injector comprising:
    a plenum body, wherein the plenum body comprises:
        a recess;
        a protrusion extending laterally away from the plenum body, wherein the protrusion comprises:
            a divider disposed across an interior volume of the plenum body separating the interior volume into a first volume adjacent to the recess and a second volume extending into the protrusion, wherein the divider has at least one hole that provides fluid communication between the first volume and the second volume;
            a side wall and a bottom wall orthogonal to the side wall; and
            an opening formed through the side wall and in fluid communication with the second volume.
12. The gas injector of claim 11, wherein the second volume is within the protrusion.
13. The gas injector of claim 11, wherein the opening is disposed in the side wall of the protrusion.
14. The gas injector of claim 11, wherein the divider is spaced from a bottom surface of the protrusion by a distance of about 0.04 inches to about 0.60 inches.
15. The gas injector of claim 11, further comprising a textured surface or coating on an interior surface of the protrusion, the interior surface surrounding the second volume, wherein the textured surface or coating has projections extending away from the interior surface.
16. The gas injector of claim 15, wherein the projections extend from the interior surface a distance of about 25 microns and about 100 microns.
17. The gas injector of claim 11, wherein the plenum body further comprises a plurality of holes disposed in a top surface of the plenum body.
18. A gas injector comprising:
    a plenum body, wherein the body comprises:
        a top surface and a bottom surface opposite the top surface;
        a recess formed into the top surface; and
        a protrusion extending laterally away from the bottom surface of the plenum body, wherein the protrusion comprises:
            a divider disposed across an interior volume of the plenum body separating the interior volume into a first volume adjacent to the recess and a second volume extending into the protrusion, wherein the divider has at least one hole that provide fluid communication between the first volume and the second volume;
            a side wall; and
            an opening formed through the side wall and in fluid communication with the second volume.

19. The gas injector of claim 18, further comprising a textured surface or coating on an interior surface of the protrusion, the interior surface surrounding the second volume, wherein the textured surface or coating has projections extending away from the interior surface.

20. The gas injector of claim 18, wherein the divider has a plurality of holes that provide fluid communication between the first volume and the second volume.

* * * * *